(12) United States Patent
Bachman et al.

(10) Patent No.: US 7,777,333 B2
(45) Date of Patent: Aug. 17, 2010

(54) STRUCTURE AND METHOD FOR FABRICATING FLIP CHIP DEVICES

(75) Inventors: Mark Adam Bachman, Sinking Spring, PA (US); Donald Stephen Bitting, Sinking Spring, PA (US); Daniel Patrick Chesire, Winter Garden, FL (US); Taeho Kook, Orlando, FL (US); Sailesh Mansinh Merchant, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 33 days.

(21) Appl. No.: 11/884,328

(22) PCT Filed: Feb. 24, 2006

(86) PCT No.: PCT/US2006/006673

§ 371 (c)(1),
(2), (4) Date: May 30, 2008

(87) PCT Pub. No.: WO2006/091856

PCT Pub. Date: Aug. 31, 2006

(65) Prior Publication Data

US 2009/0072393 A1    Mar. 19, 2009

Related U.S. Application Data

(60) Provisional application No. 60/655,816, filed on Feb. 24, 2006.

(51) Int. Cl.
*H01L 23/488* (2006.01)

(52) U.S. Cl. ............. 257/737; 257/E23.021; 257/E21.508; 438/613; 438/614

(58) Field of Classification Search ............ 257/737, 257/E21.508, E23.021, E23.023; 438/612, 438/613, 614
See application file for complete search history.

(56) References Cited

U.S. PATENT DOCUMENTS

| 6,426,281 | B1 * | 7/2002 | Lin et al. | 438/612 |
| 6,462,426 | B1 * | 10/2002 | Kelkar et al. | 257/781 |
| 6,596,619 | B1 | 7/2003 | Wang et al. | |
| 6,639,314 | B2 * | 10/2003 | Boettcher et al. | 257/736 |
| 6,969,915 | B2 * | 11/2005 | Tago et al. | 257/781 |
| 2005/0017361 | A1 | 1/2005 | Lin et al. | |

FOREIGN PATENT DOCUMENTS

| JP | 2008-016514 | * | 1/2008 |
| KR | 2002052653 | * | 7/2002 |

* cited by examiner

*Primary Examiner*—Mary Wilczewski

(57) ABSTRACT

A solder bump structure and an under bump metallurgical structure. An upper surface of a semiconductor substrate comprises a first conductive pad (200) disposed thereon. A passivation layer (202) overlies the upper surface. A second conductive pad (212) is disposed in an opening (204) in the passivation layer and in contact with the first conductive pad. The under bump metallurgical structure (300) encapsulates the second conductive pad, covering an upper surface and sidewalls surfaces of the second conductive pad, protecting both the first and the second conductive pads from environmental and processing effects. According to the present invention, the conventional second passivation layer is not required. Methods for forming the various structures are also presented.

17 Claims, 6 Drawing Sheets

US 7,777,333 B2

STRUCTURE AND METHOD FOR FABRICATING FLIP CHIP DEVICES

FIELD OF THE INVENTION

The present invention relates generally to integrated circuits and more specifically to flip chip package connection structures and methods for forming flip chip package connections.

BACKGROUND OF THE INVENTION

Integrated circuits comprise a semiconductor substrate and semiconductor devices, such as transistors, formed from doped regions within the substrate. An interconnect system comprising alternating conductive and dielectric layers overlying the substrate electrically connects the doped regions to form electrical circuits.

The conductive layers comprise conductive traces formed according to a metal deposition and subtractive etch process or conductive runners formed in trenches according to a damascene process. Substantially vertical conductive plugs or vias within the dielectric layers connect overlying and underlying conductive traces and runners, including connection to the doped regions in the substrate. The conductive vias and the conductive lines are formed by employing conventional fabrication techniques including metal deposition, photolithographic masking, patterning and subtractive etching.

After fabrication and metallization (fabrication of the interconnect system) the integrated circuit is enclosed in a package comprising a plurality of external conductive elements, such as leads, pins or balls, for connecting the packaged chip to electronic components in an electronic device, typically by conductively attaching the package's external conductive elements to conductive traces on a circuit board.

To connect the integrated circuit to the conductive elements of the package, an uppermost surface of the integrated circuit (referred to as the bond pad layer) comprises a plurality of conductive bond pads to which is attached a conductive element (e.g., a bond wire, solder bump or solder ball) that connects the bond pads to the package's external conductive elements. In an aluminum-based interconnect system, an uppermost deposited aluminum layer is masked, patterned and etched to form aluminum bond pads. Underlying conductive plugs connect the bonds pads to the electrical circuits of the integrated circuit.

FIG. 6 illustrates a integrated circuit dual-in-line package 100 comprising external package leads 102. An integrated circuit 104 is affixed to a die attach area 106. Bond pads 110 (in one embodiment formed from aluminum) on an upper surface 112 of the integrated circuit 104 are connected to the package leads 102 conventionally by gold (or gold alloy) bond wires 114. Generally, the bond pads 110 vary between about 40-80 microns and 50-150 microns in length and width, respectively. The process of electrically connecting the bond pads 110 to the package leads 102 is referred to as wire bonding.

In another known package structure, referred to as flip chip or bump bonding, the interconnecting bond wires are replaced with deposited solder bumps 120 formed on the bond pads 110 of an integrated circuit 121. See FIG. 7. Electrical connection of the flip chip assembly to a package 122 of FIG. 8 is accomplished by inverting the integrated circuit 121 and soldering the bumps 120 to receiving pads 124 on the package 122. The receiving pads 124 are in conductive communication with corresponding external package conductive elements through internal conductive structures not illustrated in FIG. 8. In the example of FIG. 8, the external package conductive elements comprise an array of balls 126, forming a ball grid array for electrically connecting the packaged integrated circuit 121 to an electronic device. Alternatively, the package comprises external pins such as the pins 102 of FIG. 6, or other techniques for connecting the integrated circuit 121 to the electronic device.

Integrated circuits formed with an aluminum interconnect system and aluminum bond pads 110 can be packaged using either the wire bond process illustrated in FIG. 6 or flip chip and bump bond process illustrated in FIGS. 7 and 8.

As integrated circuit devices and interconnect systems are reduced in size and made to carry higher frequency analog signals and higher data-rate digital signals, aluminum interconnect structures can impose unacceptable signal propagation delays within the chip. Also, as via openings continue to shrink it becomes increasingly difficult to deposit conductive material in the smaller openings to form the conductive plugs.

Given these known disadvantages of aluminum interconnect structures, copper (and its alloys) is becoming the interconnect material of choice. Copper is a better conductor than aluminum (with a resistivity of 1.7 to 2.0 micro-ohms-cm compared to 2.7 to 3.1 micro-ohms-cm for aluminum), is less susceptible to electromigration (a phenomenon whereby an aluminum interconnect line thins and can eventually separate due to the electric field and thermal gradients formed by current flow through the line) and can be deposited at lower temperatures (thereby avoiding deleterious effects on other elements of the integrated circuit) in smaller openings. The lower resistance of copper reduces signal propagation time within the interconnect structures.

A damascene process, a preferred technique for forming copper interconnect structures, integrally forms both the conductive vertical via portion and the conductive horizontal portion of each layer of the copper interconnect structure. The damascene process forms a vertical via opening followed by an overlying horizontal trench in a dielectric layer. A metal deposition step simultaneously fills both the via and the trench, forming a complete metal interconnect layer comprising a substantially vertical conductive via and a substantially horizontal conductive runner. A chemical/mechanical-polishing step planarizes the dielectric surface by removing copper deposits formed on the surface during copper deposition.

An example of a completed prior art damascene structure is illustrated in the cross-sectional view of FIG. 9, comprising a dielectric layer 138 deposited or formed on a lower level interconnect structure 139. An opening formed in the dielectric layer 138 is filled with a suitable conductive material 140, such as copper, to form a conductive trench 142 and a conductive via 144 in contact with the lower level interconnect structure 139. As is well known in the art, copper bond pads are formed in the topmost metalization layer of the integrated circuit when a damascene process is employed to form the conductive interconnect system.

Flip chip technology has become increasingly popular for devices having a large number of input/output terminals as the bumps can be formed over an entire face of the integrated circuit (referred to as area-array bump configurations) with a higher density than the bond pads 110 of FIG. 6. Area-array bump configurations offer significant advantages over wire bonding and are typically used where chip performance and/or form factor outweighs all other considerations. Peripheral-array bump configurations (in which one or two bump rows in a linear or staggered arrangement are disposed proximate a periphery of the integrated circuit) offer shorter interconnect distances and therefore shorter transmission delay times.

Although attempts have been made to apply wire bonds directly to copper bond pads, these techniques are not widely used in commercial fabrication processes because copper surfaces are easily oxidized and therefore are difficult to probe using conventional probe techniques. Flip-chip solder bump methods are more amenable for use with copper bond pads. Bumps can be formed on the copper and the bumps probed, but the in-process probing is still problematic. By contrast, the aluminum pad provides a well known electrical contact pad for in-process and wafer probing.

Flip chip technology can be costlier than conventional wire bonding technology as it requires additional processing steps. Two or more additional material layer depositions and at least an equal number of mask levels and etch steps are necessary to fabricate under-bump metallurgical layers that are required intermediate to the bonding pad and the solder bump.

Conventional flip chip fabrication processes also form dual passivation layer stacks (each layer may comprise sub-layers of different dielectric materials) on the upper surface of the integrated circuit. Each passivation layer is fabricated according to multi-layer dielectric deposition steps (which may be performed in one or more cluster tools), followed by patterning, lithographic, etch and post-etch steps. Semiconductor manufacturers seek to limit mask and etch steps to reduce processing costs.

A first passivation layer (often referred to as a wafer passivation layer) protects the upper or final copper metal interconnect layer and the copper pads disposed therein. A second passivation layer (often referred to as a final passivation layer) protects the aluminum pad formed over the copper pad.

FIG. 10 illustrates a final assembly of a solder bump or flip chip structure for a copper-based interconnect structure according to a conventional prior art process. A substrate 198 comprises multiple alternating layers of dielectric material and copper interconnects overlying a semiconductor material in which doped regions have been formed. Copper bond pads 200 are formed within a trench or opening of the substrate 198 according to a damascene process for connecting the interconnect structures within the substrate 198 (and thus the electrical circuits within the substrate 198) to the package leads 102 of the package 100 of FIG. 6 or to the balls 126 of the package 122 of FIG. 8.

A wafer passivation stack 202 (typically a stack of dielectric material layers comprising, e.g., silicon dioxide, silicon nitride, silicon carbide or combinations thereof) is deposited over the bond pads 200 and selectively etched to form openings that expose regions of the copper bond pads 200. Aluminum pads or caps 212 are deposited within the openings.

A final passivation layer 214 (typically a multi-layer stack with the constituent layers not shown in FIG. 10) comprising, for example, silicon carbide, silicon nitride, silicon dioxide or combinations thereof, is deposited and selectively etched to form openings that expose the underlying aluminum pad 212. An under-bump metallurgical (UBM) layer (or layers) is deposited and selectively etched to form UBM structures 218 that overlay and contact the aluminum pad 212 and overlay a region of the final passivation layer 214. A solder bump 220 is formed over the UBM structures 218 to form the flip-chip interconnect.

With the final passivation layer 214 disposed over the aluminum cap 212, certain structure position management matters must be considered when locating and forming the opening in the layer 214 for receiving the UBM structures 218 and the solder bump 220. Typically this opening (having a largest dimension of about 70-80 microns) is smaller than the aluminum pad 212 (having a largest dimension of more than about 100 microns) and thus must be properly located relative to the pad 212. The UBM structure 218 is typically smaller than the aluminum pad 212. These variations in size must be properly managed and positional tolerances established to ensure that the solder bump 220 is ultimately conductively connected to the copper pad 200.

As illustrated in FIG. 10, it is also desired for the final passivation layer 214 to extend over edges 212A of the aluminum pad 212. For example, the opening in the passivation layer 214 is typically smaller by several microns (about four microns in one example) than the aluminum pad 212 to permit the passivation layer material to cover and protect the edges 212A and protect the aluminum pad 212 from environmental effects such as oxidation. As the overlap region is increased by shrinking the passivation layer opening, the protection provided by the passivation layer 214 improves (and the resistance to electromigration may be degraded).

Since the solder bumps 220 require a larger bonding area than the bond wires 114 of FIG. 1, the aluminum pads 212 employed in flip chip interconnects should be larger than the conventional bond pads 110 of FIG. 1, requiring that the openings in the final passivation layer 214 also be made larger. When scaling up these dimensions, the relationship between the aluminum pads 212 and the final passivation layer openings must be maintained to protect the aluminum pads 212. The present invention teaches methods and structures to provide such protection.

SUMMARY OF THE INVENTION

According to one embodiment, the present invention comprises a method for forming a solder bump. The method further comprising, forming a first conductive pad in an upper surface of a semiconductor substrate, forming a passivation layer over the upper surface, forming an opening in the passivation layer to expose an upper surface of the first conductive pad, forming a second conductive pad through the opening in contact with the upper surface of the first conductive pad and extending to proximate regions of the passivation layer, forming an under-bump metallurgical structure on exposed surfaces of the second conductive pad and forming the solder bump on an upper surface of the under-bump metallurgical structure.

According to another embodiment, a solder bump structure comprises a semiconductor substrate, a first conductive region disposed in an upper surface of the substrate, a passivation layer overlying the first conductive region and having an opening defined therein for exposing a portion of the first conductive region, a second conductive region within the opening and in contact with the first conductive region, an under-bump metallurgical structure disposed on exposed surfaces of the second conductive region; and a solder bump overlying the under-bump metallurgical structure.

BRIEF DESCRIPTION OF THE DRAWINGS

The present invention can be more easily understood and the advantages and uses thereof more readily apparent, when considered in view of the following detailed description when read in conjunction with the following figures wherein.

DETAILED DESCRIPTION OF THE INVENTION

Before describing in detail exemplary processes for forming solder bumps or flip chips and solder bump or flip chip structures according to the teachings of the present invention, it should be observed that the present invention resides primarily in a novel and non-obvious combination of elements and process steps. So as not to obscure the disclosure of the invention with details that will be readily apparent to those skilled in the art, certain conventional elements and steps have been presented with lesser detail, while the drawings and the specification describe in greater detail other elements and steps pertinent to understanding the invention.

Figure 1:
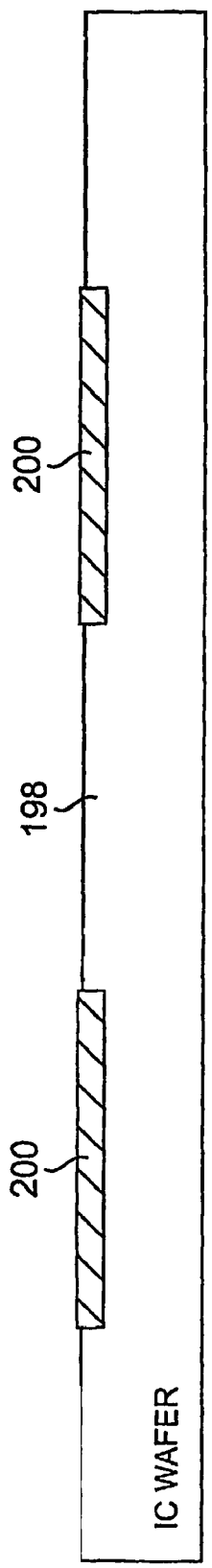
FIGS. 1-5 are cross-sectional views taken along a common plane illustrating sequential processing steps in the fabrication of a solder bump and related structures according to an embodiment of the present invention.
Figure 6:
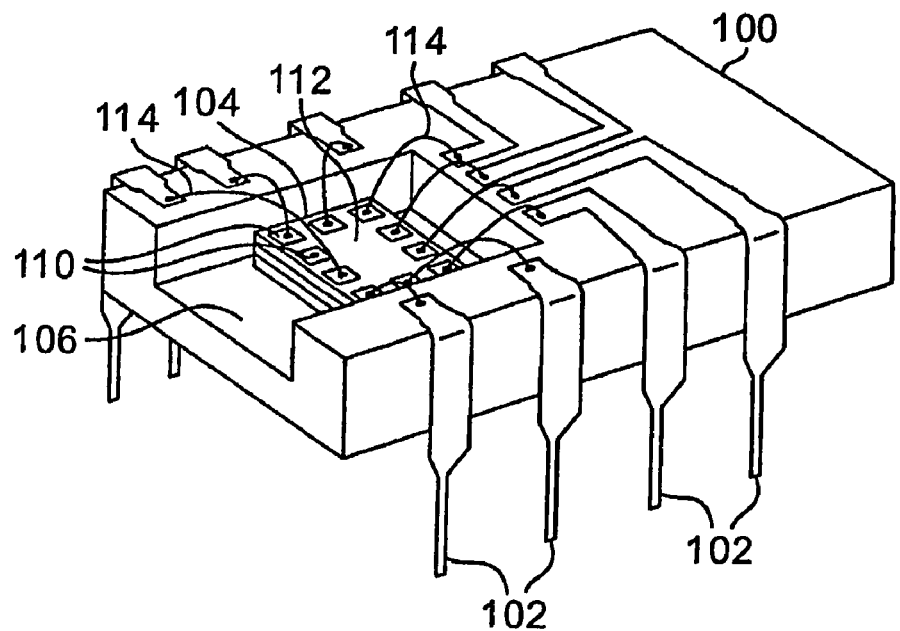
FIG. 6 is a perspective cut-away view of a prior art wire bond package for an integrated circuit.
Figure 7:
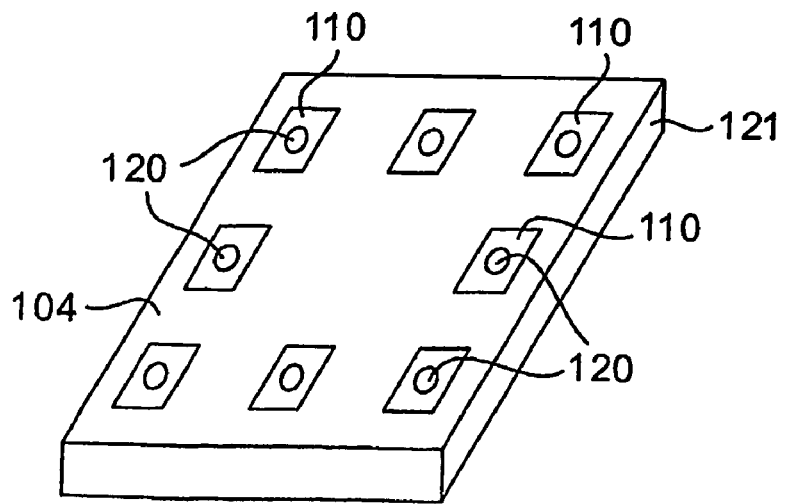
FIGS. 7 and 8 illustrate a prior art flip-chip integrated circuit device structure.
Figure 8:
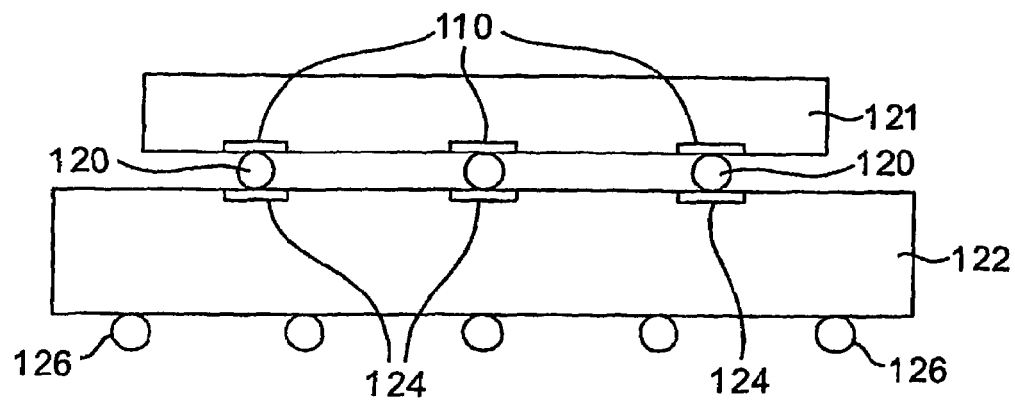
Figure 9:
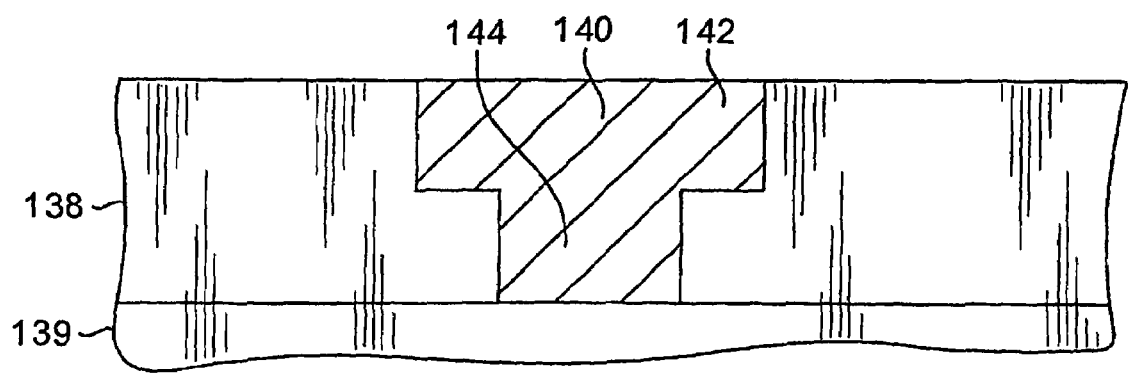
FIG. 9 is a cross-sectional view illustrating a prior art dual damascene interconnect structure.

As illustrated in FIG. 1, the copper bond pads 200 are formed within a trench or opening of the substrate 198 for providing an interconnection between the devices of the integrated circuit disposed in the substrate 198 and a conductive external terminal of a package, such as the external package leads 102 of the package 100 of FIG. 6 or the array of balls 126 of the package 122 of FIG. 8. The bond pads 200 can be formed according to known damascene or dual damascene techniques in a via opening and/or trench in the substrate 198. Typically the bond pads 200 are formed by electrodepositing copper in a substrate trench, where the substrate comprises, for example, silicon dioxide-based materials, organo-silicate materials, silicates, fluorine-based dielectrics, low-dielectric constant materials such as xerogels, aerogels, spin-on dielectrics, and combinations or multi-layers thereof.

Figure 2:
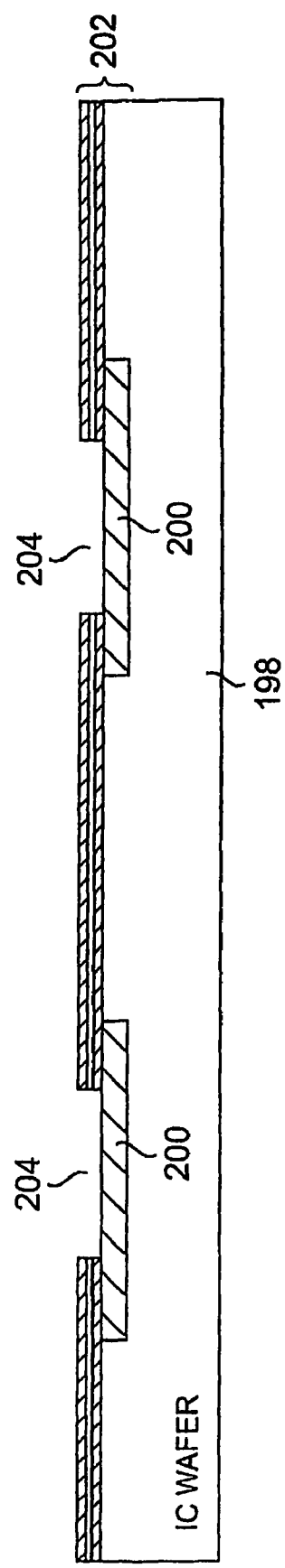

The wafer passivation stack 202 (typically a comprising one or more dielectric material layers comprising, e.g., silicon dioxide, silicon nitride, silicon carbide or combinations thereon is formed over the bond pads 200 as illustrated in FIG. 2. A photoresist layer (not shown in FIG. 2) is deposited, masked and developed to create an opening therein. Openings 204 are then formed in the passivation stack 202 according to the patterned photoresist layer. In one embodiment the three layers of the stack 202 comprise a silicon dioxide material layer and an overlying and underlying silicon nitride layer. According to other embodiments, the wafer passivation stack can comprise more or fewer than three material layers, including silicon nitride, silicon dioxide, silicon carbide and combinations thereof.

Figure 3:
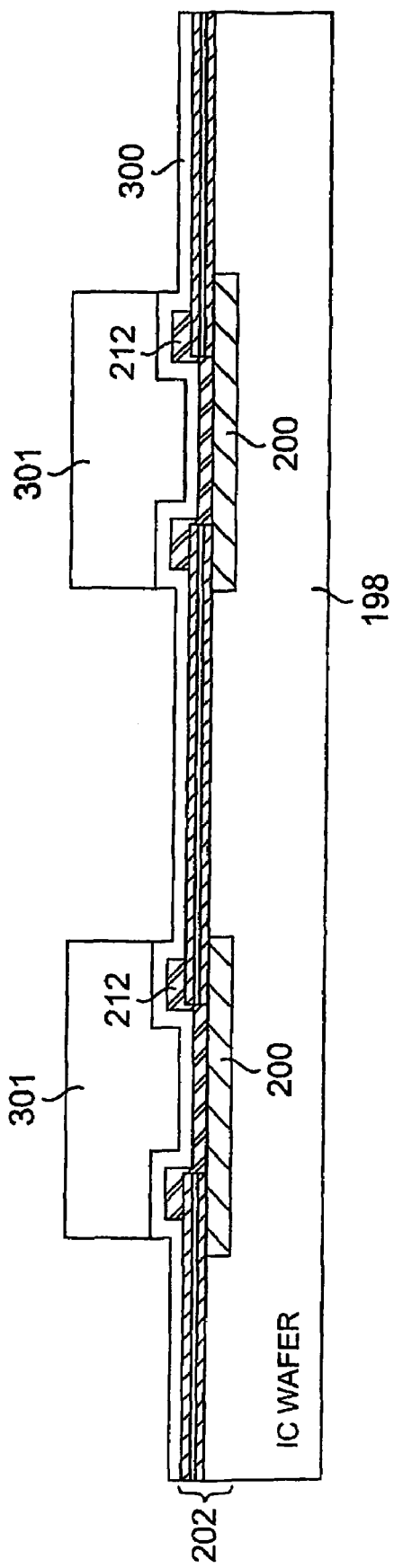

An aluminum layer is deposited and etched according to a mask pattern not shown, for forming aluminum pads or aluminum caps 212 as illustrated in FIG. 3. At the interface between the bond pads 200 and the aluminum pads 212 intermetallic compounds can form as metal atoms of one material diffuse into the other material. Such intermetallic compounds may be brittle and susceptible to cracking, causing irregularities in interface conductivity and degrading device performance. To avoid formation of the intermetallic layer, a conductive barrier layer (not shown in FIG. 3) is formed between the aluminum pads 212 and the copper bond pads 200. Exemplary materials comprising the conductive barrier layer include: tantalum, tantalum-nitride and titanium nitride.

Figure 10:
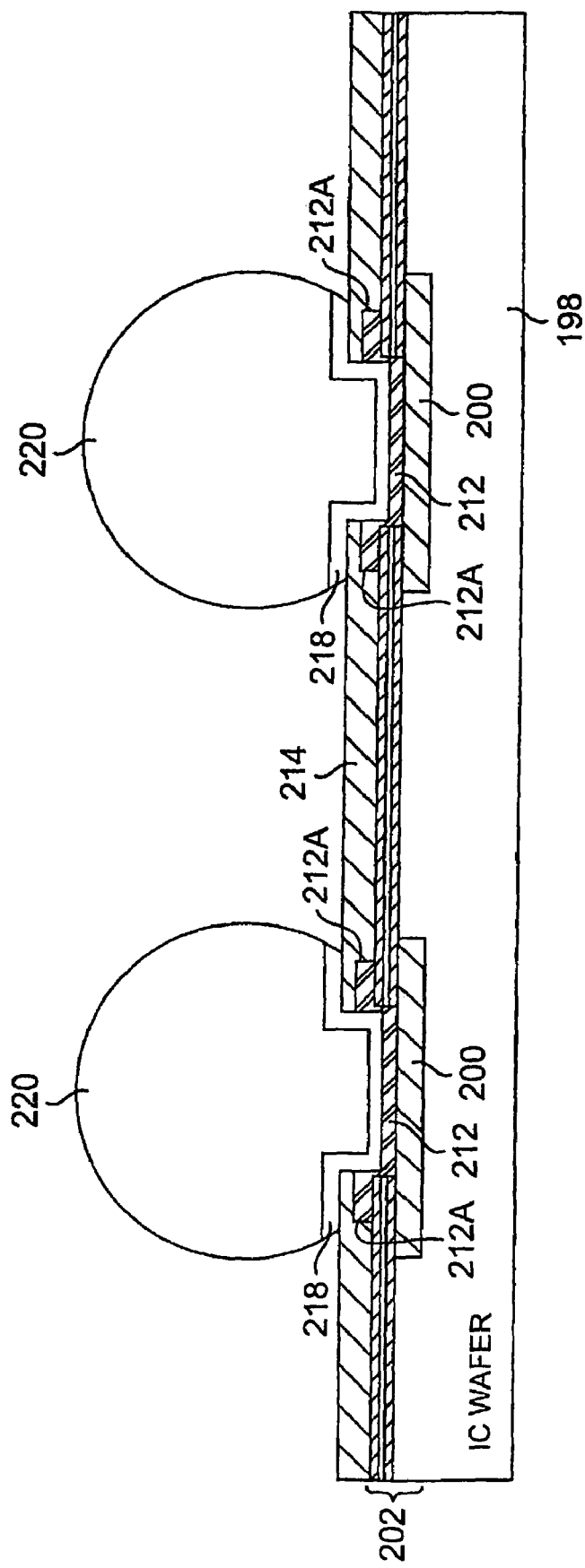
FIG. 10 is a cross-sectional view illustrating a prior art solder bump structure In accordance with common practice, the various described device features are not drawn to scale, but are drawn to emphasize specific features relevant to the invention. Reference characters denote like elements throughout the figures and text.

According to the prior art, at this point in the fabrication process, the final passivation layer 214 of FIG. 10 is formed and patterned (using a photolithographic masking technique) to define openings for receiving the under-bump metallurgical material 218 of FIG. 10. Formation and patterning of the final passivation layer 214 requires several processing steps and at least one mask layer.

According to the present invention, an under-bump metallurgical (UBM) structure 300 (typically a multi-layer structure but the individual layers are not illustrated in FIG. 3) is blanket deposited over the substrate 198, including over the aluminum pads 212 as illustrated in FIG. 3. An upper material layer of the UBM structure 300 allows for better bonding and wetting of the later-formed solder bump 220 to form an adhesion bond with mechanical integrity and acceptable reliability under mechanical and heat stresses. A lower material layer of the UBM structure 300 provides good adhesion to the aluminum pad 212. An intermediate layer serves as a barrier to reduce formation of intermetallic compounds of the overlying and underlying material layers. The UBM structure also defines a size of the later-formed solder bump 220.

According to a preferred embodiment, the UBM structure is a three-layer structure having a thickness of about 1.5 microns and comprising a lower aluminum layer, an intermediate nickel-vanadium layer and an upper copper layer. Other embodiments of the UBM structure may comprise material layers of chromium, titanium, tungsten, nickel, tantalum, refractory materials, molybdenum and compounds of these materials.

Figure 4:
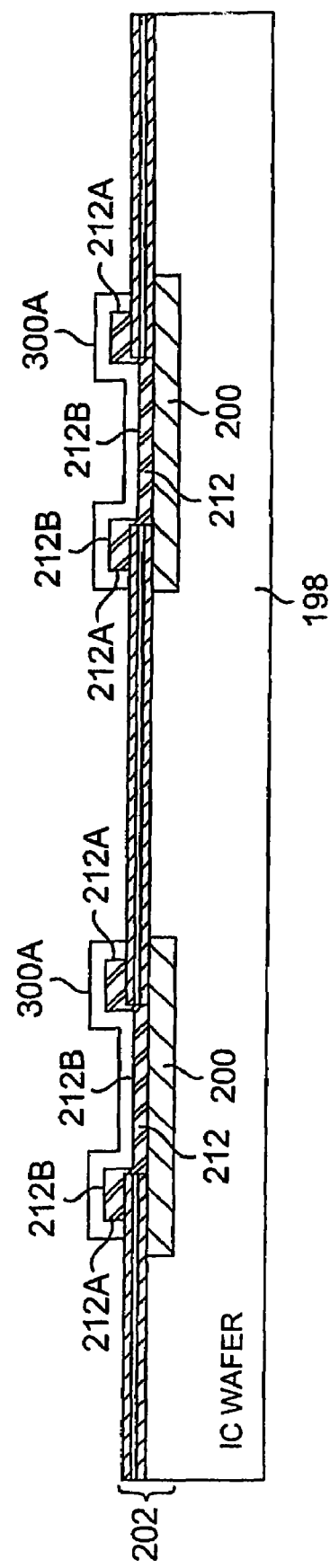

A photoresist layer is deposited and patterned to form photoresist structures 301 in FIG. 3. The UBM layer 300 is patterned according to the photoresist structures 301 to form under-bump metallurgical structures 300A (preferably circular in shape) extending over side surfaces 212A and an upper surface 212B to encapsulate the aluminum pads 212. See FIG. 4. Either a wet etch or a dry etch process can be used to etch the UBM layer 300. Preferably, the etch process uses wet etch chemistries suitable for removing the individual material layers of the UBM layer 300.

Figure 5:
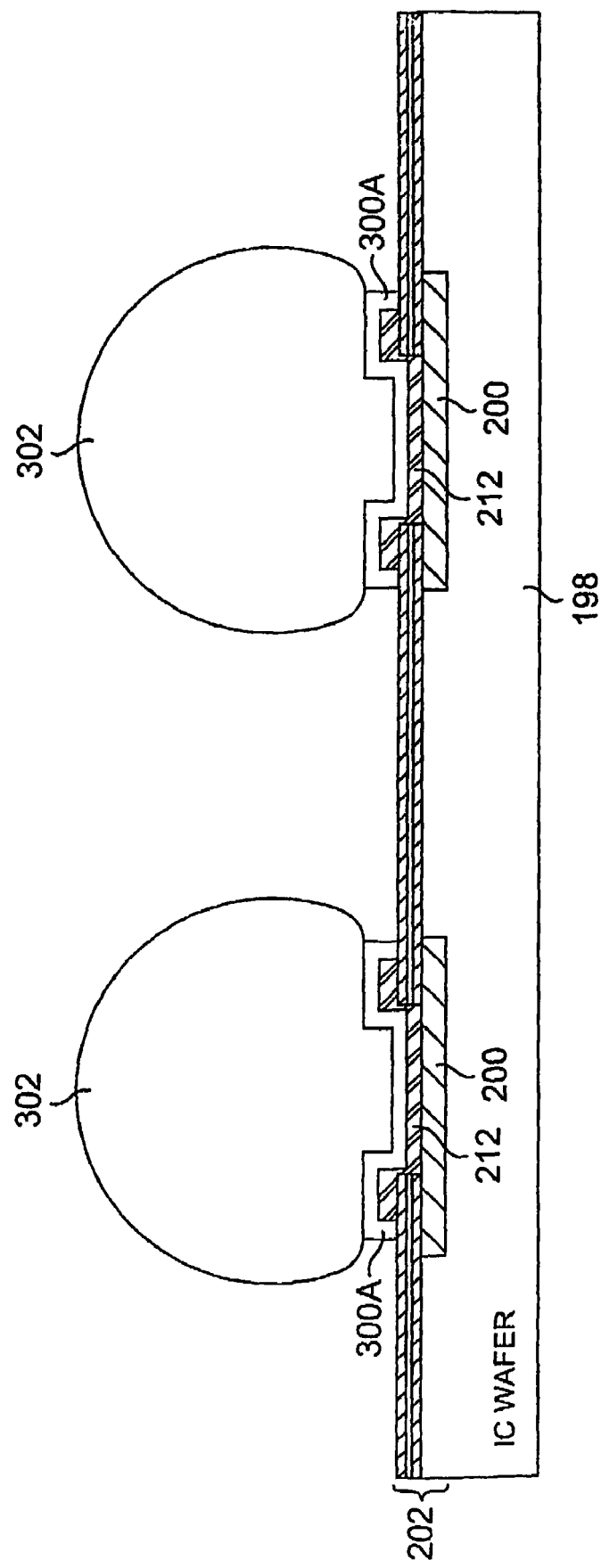

FIG. 5 illustrates solder bumps 302 formed according to known processes (typically according to a solder reflow process) over the under bump metallurgical structures 300A. The solder bump 302 comprises lead-based or lead-free materials.

The present invention eliminates the second layer of passivation, i.e., the final passivation layer 214 in the prior art FIG. 10, for flip chip or solder bump bonded integrated circuits. As can be seen from FIG. 5, according to the invention, the under-bump metallurgical structures 300A encapsulate the aluminum pads 212 (referred to as direct bump of aluminum). Complete pad encapsulation protects the aluminum pads 212 from undercuts that may be formed during subsequent processing steps and from exposure to contaminants. Thus encapsulation by the UBM structures 300A serves the same functions as the final passivation layer 214 of prior art FIG. 10. Integrated circuit integrity is not compromised since the first passivation layer, i.e., the wafer passivation layer 202, is present to protect the device from potentially damaging environmental effects.

Elimination of the final passivation layer 214 according to the present invention offers significant cost savings (e.g., about $60 to $150 per wafer depending on wafer size, fabrication line characteristics, and the applicable technology node), improves cycle time (one entire processing module for depositing and patterning the dielectric second or final passivation layer is eliminated) and improves wafer yield for those wafers that employ the flip chip or bump bonding techniques.

Additionally, the structural and process features of the present invention improve step coverage of the under-bump metallurgical structures 300A over the aluminum pads 212, since the UBM structures 300A, not the final passivation layer 214 (see FIG. 10), encapsulate the aluminum pads 212. The electromigration performance is improved as the current redistribution through the UBM structure 300A reduces potential current crowding effects within the aluminum pads 212. The mechanical and metallurgical interfaces of the various material layers are improved. The current capacity is expected to increase as the aluminum pads 212 are completely encapsulated by the under-bump metallurgical structures 300A. Corrosion effects due to galvanic activity are reduced as the UBM structures 300A (in conjunction with the wafer passivation layer 202) completely encapsulate and thereby reduce exposure of the metal pads (both the copper pads 200 and aluminum pads 212). The requirement for the final passivation layer 214 of the prior art to define the interconnect and protect the integrated circuit structures against diffusion of impurities is no longer necessary since the UBM structure 300A provides these functions.

The teachings of the present invention are not limited to use with the copper pads 200, but can be used with other conductive materials that connect a microelectronic device or component to a package, an assembly board or to a substrate. The invention is also not limited to copper and aluminum metallizations as described herein, as those skilled in the art recognize their substitution with other conductor systems, including conductor systems that may be used with optical interconnect systems.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a solder bump, comprising:
   forming a first conductive pad in a trench formed in a semiconductor substrate, the first conductive pad having an exposed upper surface;
   forming a passivation layer over the upper surface;
   forming an opening in the passivation layer to expose an upper surface of the first conductive pad;
   forming a second conductive pad through the opening in contact with the upper surface of the first conductive pad and extending to regions of the passivation layer proximate to the opening;
   forming an under-bump metallurgical structure on exposed surfaces of the second conductive pad wherein the under-bump metallurgical structure is formed on and exposed upper surface and exposed sidewall surfaces of the second conducive pad; and
   forming the solder bump on an upper surface of the under-bump metallurgical structure.

2. The method of claim 1 wherein the step of forming the under-bump metallurgical structure further comprises encapsulating the second conductive pad within the under-bump metallurgical structure.

3. The method of claim 1 wherein the step of forming the first conductive pad comprises forming a copper pad.

4. The method of claim 1 wherein the step of forming the second conductive pad comprises forming an aluminum pad.

5. The method of claim 1 wherein the semiconductor substrate comprises interconnect structures underlying the first conductive pad, and wherein the first conductive pad is in conductive communication with at least one of the interconnect structures.

6. The method of claim 1 wherein the solder bump provides electrical connection between conductive regions in the substrate and an integrated circuit package, an electronic component assembly board or a receiving substrate.

7. The method of claim 1 wherein a material of the first conductive pad is different from a material of the second conductive pad.

8. A method for fabricating a semiconductor device, comprising:
   providing an integrated circuit having a passivation layer and bond pads disposed in trench formed in an upper surface each bond pad exposed through an opening in the passivation layer;
   forming a conductive pad through the opening in contact with the upper surface of the bond pad, the conductive pad extending to regions of the passivation layer adjacent the opening;
   forming an under-bump metallurgical structure on exposed surfaces of the conductive pad wherein the under-bump metallurgical structure is formed on an exposed upper surface and exposed sidewall surfaces of the conductive pad; and
   forming the solder bump on an upper surface of the under-bump metallurgical layer.

9. The method of claim 8 wherein the step of forming the bond pad comprises forming a copper bond pad.

10. The method of claim 8 wherein the step of forming the conductive pad comprises forming an aluminum conductive pad.

11. The method of claim 8 wherein the solder bump provides electrical connection between conductive regions in the substrate and an integrated circuit package, an electronic component assembly board or a receiving substrate.

12. A solder bump structure comprising:
   a semiconductor substrate;
   a first conductive region disposed in a trench formed in the substrate, the first conductive region having an exposed upper surface;
   a passivation layer overlying the first conductive region and having an opening defined therein for exposing a portion of the first conductive region;
   a second conductive region within the opening and in contact with the first conductive region;
   an under-bump metallurgical structure formed in a single masking step disposed on exposed surfaces of the second conductive region wherein the under-bump metallurgical structure overlies an upper surface and sidewall surfaces of the second conductive region; and
   a solder bump overlying the under-bump metallurgical structure.

13. The solder bump structure of claim 12 wherein the first conductive structure comprises a bond pad for an integrated circuit, and wherein the substrate comprises doped semiconductor regions and interconnect structures, and wherein the bond pad is in conductive communication with an interconnect structure.

14. The solder bump structure of claim 12 wherein the second conductive region overlies a region of the passivation layer peripherally adjacent the opening.

15. The solder bump structure of claim 12 wherein a material of the first conductive region comprises copper and a material of the second conductive region comprises aluminum.

16. The solder bump structure of claim 12 wherein the solder bump provides an electrical interconnect in an optical interconnect system.

17. The solder bump structure of claim 12 further comprising a package, wherein the solder bump provides electrical connection between conductive regions in the substrate and conductive elements disposed external the package.

* * * * *